(12) United States Patent
Bichler et al.

(10) Patent No.: US 6,682,635 B2
(45) Date of Patent: Jan. 27, 2004

(54) CATHODIC SPUTTERING CHAMBER FOR APPLYING MATERIAL TO THE SURFACE OF A SEMICONDUCTOR WAFER LOCATED THEREIN

(75) Inventors: Hermann Bichler, Rohrbach (DE); Reinhard Hanzlik, Freising (DE); Frank Mueller, Freising (DE); Stefan Fries, Landshut (DE); Helmut Endl, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/085,446

(22) Filed: Feb. 28, 2002

(65) Prior Publication Data

US 2002/0162739 A1 Nov. 7, 2002

(51) Int. Cl.⁷ ............................................. C23C 14/34
(52) U.S. Cl. .............................. 204/298.11; 204/298.23
(58) Field of Search ........................ 204/298.11, 298.23

(56) References Cited

U.S. PATENT DOCUMENTS 5,391,275 A * 2/1995 Mintz .................... 204/192.32
6,045,670 A * 4/2000 Adams et al. ......... 204/298.11

OTHER PUBLICATIONS

English translation of JP 5–82444.*

* cited by examiner

Primary Examiner—Steven H. VerSteeg
(74) Attorney, Agent, or Firm—Yingsheng Tung; Wade James Brady, III; Frederick J. Telecky, Jr.

(57) ABSTRACT

A chamber (10) for applying material to the surface of a semiconductor wafer (18) located in the chamber by means of cathodic sputtering a target (26), located on a target mount (24), of the material to be applied or a component thereof, contains a wafer mount (14) on which the semiconductor wafer (18) to be coated is located. The wafer mount (14) is provided movable in the chamber (10) between a charging position for application of the semiconductor wafer and a sputtering position in which semiconductor wafer is located at a predefined distance away from and opposite to the target. Provided in the chamber is a shielding support (30) which is supported by the edge of the semiconductor wafer in the sputtering position in maintaining it in contact with the wafer mount, the shielding support extending between the edge of the semiconductor wafer and a portion adjoining the edge of the target on the target mount and thus defining a sputtering space between the target and the semiconductor wafer.

8 Claims, 1 Drawing Sheet

CATHODIC SPUTTERING CHAMBER FOR APPLYING MATERIAL TO THE SURFACE OF A SEMICONDUCTOR WAFER LOCATED THEREIN

FIELD OF THE INVENTION

The present invention relates to a cathodic sputtering chamber for applying material to the surface of a semiconductor wafer located in the chamber by means of cathodic sputtering a target, located on a target mount, of the material to be applied or a component thereof, the semiconductor wafer being located on a wafer mount by which it is movable in the chamber between a charging position for its application to the wafer mount and a sputtering position in which it is located at a predefined distance away from and opposite to the target.

BACKGROUND OF THE INVENTION

One method of applying coatings to the semiconductor wafers in the fabrication of integrated circuits is cathodic sputtering. In this method, the semiconductor wafer to be coated is brought into a chamber so that it is located at a predefined distance away from and opposite to the target composed of the material, or a component thereof, as is to be deposited as a coating on the semiconductor wafer. In this chamber an argon plasma is generated at low pressure. In this arrangement the positively charged argon ions are accelerated in the plasma to the target having a negative potential. Due to the impact of the argon ions, material is sputtered from the target which is then deposited on the surface of the semiconductor wafer located opposite the target, together with any other material as introduced necessary into the sputtering space. One problem encountered in the application of the cathodic sputtering method is that the material sputtered from the target surface deposits not only on the surface of the semiconductor wafer to be coated, but on all inner walls of the chamber in which the plasma is generated. To prevent this unwanted deposition on the inner walls of the chamber, a shielding device is installed in the chamber which surrounds the space between the target and the semiconductor wafer like a cylinder and features an annular radial section extending towards the semiconductor wafer, the diameter of which is smaller than that of the target. To secure the semiconductor wafer to a wafer mount a supporting device is used which surrounds the semiconductor wafer annularly in holding it against the wafer mount by means of a protruding lip. Both the shielding device as well as the supporting device need to be removed from the chamber at regular intervals for cleaning, since the target material depositing thereon tends to fragmentate after several deposition cycles, resulting in particles being liberated which could be deposited on the surface of the semiconductor wafer and ruin parts of the integrated circuits formed thereon. If cleaning is not done often enough, the reject rate of the semiconductor circuits increases sigificantly. However, frequent cleaning sigificantly reduces the thruput of semiconductor wafers to be coated, since having to open the chamber, remove and clean the shielding device and supporting device, subsequently reinstalling these devices and re-evacuating the chamber, all take up a lot of time. The problem of the target material fragmenting and being deposited unwantedly on the shielding device and supporting device occurs more particularly in the case of brittle materials such as TiN or TiW normally requiring to be deposited on the surface of the semiconductor wafers in the fabrication of integrated semiconductor circuits.

DETAILED DESCRIPTION OF THE PREFERRED EMBODIMENTS

The invention is based on the objective of providing a chamber of the aforementioned kind, application of which permits boosting the thruput of the semiconductor wafers to be coated whilst simultaneously reducing rejects due to contamination of the surface of the semiconductor wafer by particles from the target material. In accordance with the invention this objective is achieved in a chamber of the aforementioned kind by a shielding support which is supported by the edge of the semiconductor wafer in the sputtering position in maintaining it in contact with the wafer mount, the shielding support extending between the edge of the semiconductor wafer and a portion adjoining the edge of the target on the target mount and thus defining a sputtering space between the target and the semiconductor wafer.

In the chamber configured in accordance with the invention, the semiconductor wafer is held on the wafer mount by means of the shielding support which simultaneously serves as a shield preventing particles sputtered from the target being deposited on the inner walls of the chamber subjected to a low pressure. It is due to this configuration that, now, only one component, namely the shielding support, needs to be removed from the chamber and cleaned after a certain number of coating cycles. Due to the special arrangement of the shielding support between the edge of the semiconductor wafer and a portion adjoining the edge of the target on the target mount, the shielding support is configurable so that its contour features no sudden change in direction such as corners or kinks conducive to fragmentation for deposited target material, thus greatly reducing the probability of semiconductor wafers to be coated being contaminated by fragmentation particles.

Advantageous aspects of the invention are characterized in the sub-claims. It is particularly good practice to configure the shielding support with a concave curved contour between the semiconductor wafer and the edge of the target, since this greatly reduces the fragmentation tendency of the deposited target material.

In one special configuration the shielding support is made of aluminum-coated sheet steel. This material combination makes for particularly long employment of the shielding support. In the cleaning process, both the deposited target material as well as the aluminum coating are removed whilst the sheet steel remains untouched. After a repeat aluminum coating the shielding support can be reinstalled in the chamber, thus making for a very long useful life of the shielding support.

Figure 1:
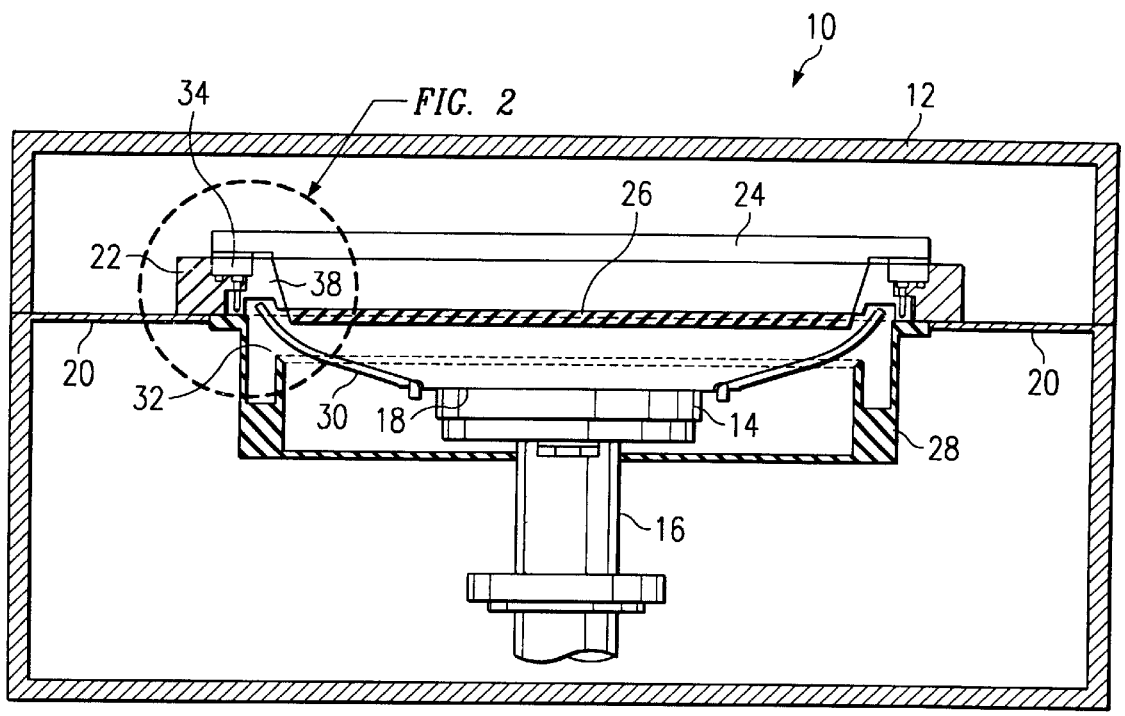
FIG. 1 is a cross-sectional diagram of a cathodic sputtering chamber according to an embodiment of the invention.
Figure 2:
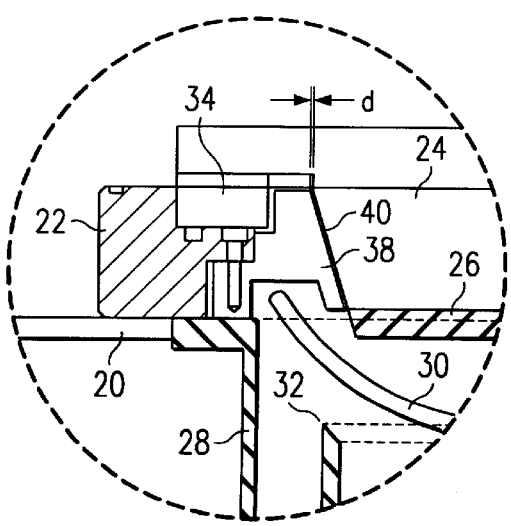
FIG. 2 is a detail diagram of the embodiment in FIG. 1.

Further advantages of the invention will be detailed by way of an example embodiment of a cathodic sputtering chamber configured in accordance with the invention with reference to the drawings showing the example embodiment in a cross-section view (FIG. 1) and an enlarged portion "A" thereof (FIG. 2).

Referring now to FIG. 1 there is illustrated how the chamber 10 is surrounded by a pressure-tight outer wall 12 so that a low pressure of the order of 1 Pa can be generated therein. The chamber 10 contains a wafer mount 14 which can be moved by means of a spindle 16 between the elevated position, as shown, and a lowered charging position. In the lowered charging position a semiconductor wafer 19 can be placed by means of the devices (not shown) on the upper surface area of the wafer mount 14. The semiconductor wafer 18 is then being brought into the elevated position as shown, together with the wafer mount 14, it being in this position that a material coating is deposited thereon by cathodic sputtering. The wafer mount 14 simultaneously serves to maintain the semiconductor wafer at an elevated temperature in the region of 200° C.

As evident from the drawing, provided in the chamber is an intermediate wall 20 supporting via an adapter 22 a target mount 24 on the underside of which, as shown in the drawing, a target 26 of a material suitable for cathodic sputtering onto the surface of the semiconductor wafer 18 is provided. Connected to the intermediate wall 20 is also a supporting ring which surrounds the wafer mount 14 and the semiconductor wafer located thereon; the purpose of this supporting ring 28 will be explained later on.

In the position of the wafer mount 14 as shown in the drawing, the edge of the semiconductor wafer 18 is located by a shield support 30 extending from this edge up to the edge of the target 26 of the portion bordering the target mount 24. This shield support 30 urges by its own weight the semiconductor wafer 18 onto the wafer mount 14 and securely holds it there in place. At the same time the shield support 30 defines the space between the surface of the semiconductor wafer 18 and the target 26 which forms the actual sputtering space.

In implementing sputtering, an argon atmosphere is generated in the chamber at the aforementioned low pressure. Relative to the wafer mount 14 and the semiconductor wafer 18 located thereon, the target 26 is connected to a negative DC voltage, selected high enough to produce an argon plasma in the sputtering space between the semiconductor wafer and the target. The resulting positive argon ions impact the target 26 and sputter material from the target which is deposited on all surface areas located in the sputtering space between the semiconductor wafer and the target surface, i.e. part of the target material is deposited, undesirably so, on the surface of the semiconductor wafer 18 whilst another part of the target material is deposited on the surface area of the shield support 30 facing the sputtering space.

Referring now to FIG. 2 there is illustrated a detail A on a magnified scale as to how the target mount 24 is held by the intermediate wall 20. The adapter 22 rests on a ring 34 of insulating material which is in turn supported by the adapter 22. The adapter 22 is made of an electrically conductive material so that, like the intermediate wall 20, supporting ring 28, semiconductor wafer 18 and shield support 30, it too has ground potential. Due to using the ring 34 of an insulating material, the target mount 24 can be placed at the desired high negative potential. Located in the space between the sidewall 40 of the target mount 24 and the adapter 22 is a dark room cover 38, connected to the adapter 22, and likewise made of an electrically conductive material. Provided between the sidewall 40 of the target mount 24 and the surface area of the dark room cover 38 facing this sidewall is a spacing d which is smaller than the free path distance of the ions forming during sputtering in the sputtering space. This results in no plasma being able to burn in the spacing d and thus no material can be fragmented from the sidewall 40 of the target mount 24, i.e. the coating to be deposited on the semiconductor wafer 18 is not contaminated by the material of the target mount 24. In the portion surrounding the upwards facing end of the shield support 30—between the side surface area of the target 26, the surface area of the dark room cover 38 facing downwards as shown in FIG. 2, and the side surface area of the supporting ring 28—a plasma burns, however, resulting, on the one hand, in the ions materializing in this portion being sputtered from the side surface area of the target 26, whilst, on the other, preventing material from being sputtered from the material of the dark room cover 38 since this, as already mentioned, is at ground potential.

As evident from the drawing, the shield support 30 is configured curved concavely between the edge of the semiconductor wafer 18 and the portion at the edge of the target 26. In the region of the target edge, between the shield support 30 and the target, such large spacings exist so that in this portion too, a plasma burns. This achieves material being removed not only from the face of the target 26 facing the semiconductor wafer 18 but also from the side surface areas of the target as contributing towards coating the semiconductor wafer 18.

Once a sufficiently thick coating of the target material has been produced on the semiconductor wafer 18, the plasma is shut off and the wafer mount 14 is lowered by means of the spindle 16 down to a charging position (not shown) in which the semiconductor wafer 18 can be removed from the wafer mount by means of suitable means (not shown), after which a new semiconductor wafer can be placed on the wafer mount 14 and positioned for a further deposition process. Whilst the wafer mount 14 is being lowered, the outer surface area of the shield support 30 comes up against an annular supporting edge 32 of the supporting ring 28. This prevents any further lowering of the shield support 30 whilst simultaneously releasing the semiconductor wafer 18 so that it can be removed from the wafer mount 14 in the lowered charging position. On being elevated by the wafer mount 14, the new semiconductor wafer 18 comes up against the shield support 30 by its edge which lifts it into the position as shown in the drawing in which the weight of the shield support 30 is sufficient to hold the semiconductor wafer 18 on the wafer mount 14.

In actual practice the target material may be TiW so that a coating of this material can be deposited on the semiconductor wafer. If TiN is to be deposited, Ti is used as the target material and nitrogen is introduced into the sputtering chamber, TiN then being deposited as the coating on the semiconductor wafer in the subsequent process in the sputtering chamber. The shield support 30 is made of sheet steel, coated with aluminum. By its shape and contour the shield support 30 prevents material particles sputtered from the target from gaining access to the inner surface areas of the outer wall 12 and settling there. The sputtered particles will, of course, be deposited on the shield support 30 itself, thus requiring it to be removed from the chamber and cleaned from time to time. This cleaning process requires the removal of both the deposited target material as well as the aluminum, without, however, detrimenting the steel material by the cleaning process. Prior to inserting the shield support 30 into the outer wall 12 the steel material is recoated with aluminum.

It is to be noted that due to its concave configuration, the shield support 30 has no sudden changes in contour, such as corners and edges from which target mount being deposited in the case of the sputtering process could fragment, thus effectively preventing contamination of the semiconductor wafer 18 due to such fragmented target material. Since there is no tendency of the target material fragmenting from the shield support 30, it is now possible to implement a greater number of sputtering cycles without the shield support 30 needing to be cleaned.

Accordingly, making use of the chamber as described permits boosting semiconductor wafer thruput with fewer rejects.

What is claimed is:

1. A cathodic sputtering chamber for applying material to the surface of a semiconductor wafer located in the chamber, comprising:
    a target mount;
    a target, located on the target mount, of the material to be applied or a component thereof;
    a wafer mount on which the semiconductor wafer is located, said wafer mount being movable in the chamber between a charging position for applying the semiconductor wafer to the wafer mount and a sputtering position in which the semiconductor wafer is located at a predefined distance away from and opposite to the target;
    a shielding support which is supported by the edge of said semiconductor wafer in said sputtering position thereby maintaining the semiconductor wafer in contact with said wafer mount, said shielding support extending between said edge of said semiconductor wafer and a portion adjoining the edge of said target on said target mount and thus defining a sputtering space between said target and said semiconductor wafer, and
    a supporting ring so that said shielding support rests thereon when said semiconductor wafer is in said charging position, and is lifted from said shielding support by said semiconductor wafer when the semiconductor wafer is located in said sputtering position.

2. The cathodic sputtering chamber as set forth in claim 1, wherein said target mount comprises a disk-shaped configuration having a face and a sidewall, said target covering said face of said target mount and facing said semiconductor wafer, and further comprising a dark room cover applied at ground potential, wherein the spacing of the dark room cover from said sidewall is smaller than the mean free path length of the ions formed in said sputtering space.

3. The cathodic sputtering chamber as set forth in claim 1, wherein said shielding support is annular and configured concavely curved between an inner edge located on the edge of said semiconductor wafer and an outer edge located in a region of said target edge.

4. The cathodic sputtering chamber as set forth in claim 1, wherein said shielding support is made of sheet steel coated with aluminum.

5. A cathodic sputtering chamber, comprising:
    a wafer mount on which a wafer may be disposed;
    a supporting member; and
    an annular shielding support concavely curved between a lower edge and an upper edge, the shielding support movable between a lower position in which a portion of the upper edge of the shielding support suspends on the supporting member and is separated from the wafer mount and an upper position in which a portion of the lower edge of the shielding support is supported by the wafer mount and is separated from the supporting member.

6. The cathodic sputtering chamber in claim 5, further comprising a target mount on which a target may be disposed.

7. The cathodic sputtering chamber in claim 5, in which the wafer mount is movable between a charging position and a sputtering position.

8. The cathodic sputtering chamber in claim 7, in which the charging position of the wafer mount corresponds to the lower position of the shielding support and the sputtering position of the wafer mount corresponds to the upper position of the shielding support.

* * * * *